US006766408B2

(12) United States Patent
Nasu

(10) Patent No.: US 6,766,408 B2
(45) Date of Patent: Jul. 20, 2004

(54) SEMICONDUCTOR INTEGRATED CIRCUIT AND METHOD FOR WRITING INTO NON-VOLATILE MEMORY USING A PROGRAM RECEIVED BY EXTERNAL COMMUNICATION

(75) Inventor: Hiroaki Nasu, Fujimi-machi (JP)

(73) Assignee: Seiko Epson Corporation (JP)

( * ) Notice: Subject to any disclaimer, the term of this patent is extended or adjusted under 35 U.S.C. 154(b) by 100 days.

(21) Appl. No.: 09/881,193

(22) Filed: Jun. 14, 2001

(65) Prior Publication Data

US 2002/0018371 A1 Feb. 14, 2002

(30) Foreign Application Priority Data

Jun. 14, 2000 (JP) .......................................... 2000-178345

(51) Int. Cl.⁷ .............................................. G11C 13/00
(52) U.S. Cl. ...................................... 711/103; 711/167
(58) Field of Search ................................. 711/103, 115, 711/167

(56) References Cited

U.S. PATENT DOCUMENTS

| | | | | |
|---|---|---|---|---|
| 5,243,561 A | * | 9/1993 | Yamauchi ............... | 365/189.12 |
| 5,381,556 A | * | 1/1995 | Mitsuishi et al. ............ | 712/37 |
| 5,444,664 A | * | 8/1995 | Kuroda et al. .............. | 365/226 |
| 5,687,345 A | * | 11/1997 | Matsubara et al. ......... | 711/103 |
| 5,694,360 A | * | 12/1997 | Iizuka et al. ........... | 365/185.33 |
| 5,768,194 A | * | 6/1998 | Matsubara et al. .... | 365/185.33 |
| 5,828,977 A | * | 10/1998 | Hayashi et al. ............. | 701/115 |
| 6,006,304 A | * | 12/1999 | Mukai et al. ............... | 711/103 |
| 6,038,635 A | * | 3/2000 | Ideta | |
| 6,275,911 B1 | * | 8/2001 | Terada et al. ............... | 711/103 |
| 6,393,561 B1 | * | 5/2002 | Hagiwara et al. .......... | 713/100 |

FOREIGN PATENT DOCUMENTS

| | | |
|---|---|---|
| JP | 03-158184 | 7/1991 |
| JP | 04-114289 | 4/1992 |
| JP | 04-287294 | * 10/1992 |
| JP | 05-012511 | * 1/1993 |
| JP | 08-101821 | 4/1996 |
| JP | 10-283172 | 10/1998 |
| JP | 11-007381 | 1/1999 |
| JP | 11-149376 | 6/1999 |

* cited by examiner

Primary Examiner—Glenn Gossage
(74) Attorney, Agent, or Firm—Harness, Dickey & Pierce, P.L.C.

(57) ABSTRACT

A semiconductor integrated circuit is provided for writing into a non-volatile memory incorporated therein. In addition to the non-volatile memory, the semiconductor integrated circuit includes a central processing unit (CPU) and a communication interface that receives programs to be executed by the CPU for writing into the non-volatile memory and transmits the received programs to the CPU. The communication interface receives the programs to be executed by the CPU via an external synchronous serial communication and sends serial clocks to the CPU. In this way, a mask read only memory (ROM) for storing rewriting programs for the non-volatile memory is eliminated and the pulse width of various control signals required for writing into the non-volatile memory can be easily altered.

3 Claims, 4 Drawing Sheets

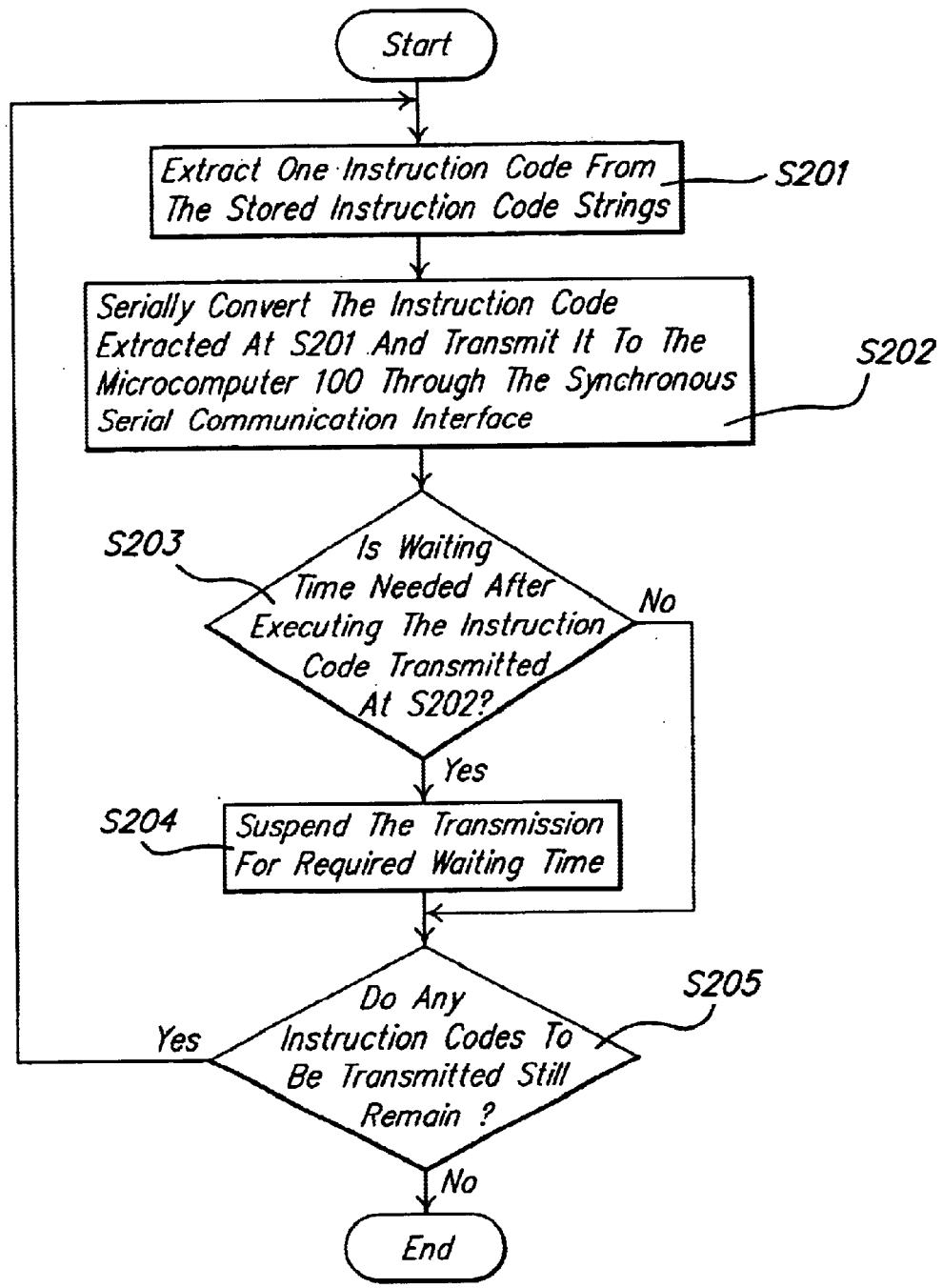

SEMICONDUCTOR INTEGRATED CIRCUIT AND METHOD FOR WRITING INTO NON-VOLATILE MEMORY USING A PROGRAM RECEIVED BY EXTERNAL COMMUNICATION

TECHNICAL FIELD

The present invention relates to a semiconductor integrated circuit such as a single chip microcomputer (hereinafter referred to as a microcomputer) having a built-in non-volatile memory such as a flash memory, an electronically erasable programmable read only memory (hereinafter referred to as EEPROM), an erasable programmable read only memory (hereinafter referred to as EPROM), or a ferroelectric random access memory (hereinafter referred to as FeRAM), and a central processing unit (hereinafter referred to as "CPU") or gate array. In particular, the present invention relates to a semiconductor integrated circuit which has no work random access memory (hereinafter referred to as RAM) and which is capable of executing programs. The invention further relates to a method for writing into a non-volatile memory incorporated in such semiconductor integrated circuits.

BACKGROUND ART

Previously, semiconductor integrated circuits having a CPU and a non-volatile memory incorporated therein have been mounted on a board and then a ROM writer communicates with the CPU through a serial interface to operate the CPU for writing programs into the non-volatile memory or updating them. This is called "on-board (in-circuit) writing". As an example, FIG. 6 depicts an example of the circuit configuration for on-board writing.

In FIG. 6, a microcomputer 300 is formed of a CPU core 301, a control register 302, a synchronous serial communication interface 303, a multiplexer 304, a flash memory 305, and a mask ROM 307. The CPU core 301 is connected to the mask ROM 307 and the multiplexer 304 through an instruction address bus B31 and an instruction bus B32. Additionally, the CPU core 301 is connected to the control register 302, the synchronous serial communication interface 303, and the multiplexer 304 through a data address bus B33 and a data bus B34.

The multiplexer 304 is connected to the flash memory 305 through a bus B35. The flash memory 305 is a non-volatile memory for storing instruction codes that the CPU core 301 should execute or data that the CPU core 301 uses.

When a program is written into the flash memory 305, a ROM writer 400 is connected to the synchronous serial communication interface 303. The ROM writer 400 transfers operation commands, address information or data by synchronous serial communications. On the other hand, the mask ROM 307 incorporated in the microcomputer 300 is a read-only memory for storing programs executed by the CPU core 301 to perform on-board writing to the flash memory 305, and the mask ROM 307 is used for communications and sequencing. The operation commands that have been transferred from the ROM writer 400 to the microcomputer 300 are executed by the on-board writing program stored in the mask ROM 307 and erasing or data writing is peformed based on the address information. Management during writing or erasing is also performed by the programs stored in the mask ROM 307.

Synchronous serial communication uses a CLK signal line 404 for transmitting clocks from the ROM writer 400 to the microcomputer 300 a RXD signal line 401 for transmitting data from the ROM writer 400 to the microcomputer 300, a TXD signal line 402 for transmitting data from the microcomputer 300 to the ROM writer 400, and a SCLK signal line 403 for transmitting and receiving serial clocks between the ROM writer 400 and the microcomputer 300.

The control register 302 is connected to the CPU core 301 as described above, and is also connected to the multiplexer 304 through a flash memory writing address bus B36, a flash memory writing data bus B37, and a control signal bus B38. The control register 302 holds data written by the CPU core 301 and outputs the data to the flash memory writing address bus B36, the flash memory writing data bus B37, and the control signal bus B38.

The multiplexer 304 is connected to the CPU core 301 and the flash memory 305 as described above, and is also connected to a switch 308 through a flash memory writing mode designating line 306. The switch 308 is turned on (closed) to ground the flash memory writing mode designating line 306 when on-board writing is conducted, and it is turned off (opened) to pull up the flash memory writing mode designating line 306 through the pull up resistor when on-board writing is not conducted. The multiplexer 304 connects the buses B31 to B34 with the bus B35 when the flash memory writing mode designating line 306 is pulled up, while it connects the buses B36 to B38 with the bus B35 when the flash memory writing mode designating line 306 is grounded.

Next, the normal operation (an operation other than on-board writing) of the microcomputer 300 shown in FIG. 6 will be described. In addition, during normal operation, the switch 308 is turned off (opened) and the flash memory writing mode designating line 306 is pulled up.

First, the CPU core 301 outputs an instruction address on the instruction address bus B31. The multiplexer 304 transmits the instruction address outputted on the instruction address bus B31 to the bus B35. The flash memory 305 receives the instruction address from the bus B35 and outputs an instruction code corresponding to the address to the bus B35. The multiplexer 304 transmits the instruction code outputted on the bus B35 to the instruction bus B32. The CPU core 301 receives the instruction code from the instruction bus B32 and executes the instruction code. In this manner, the CPU core 301 executes a series of instruction codes (a program) stored in the flash memory 305.

Next, an on-board writing operation in the conventional example will be described. When on-board writing is performed, an on-board writing operator turns on (closed) the switch 308 and a power supply of the micro computer 300, and also turns on a power supply of the ROM writer 400 to start the operation.

When the on-board writing operation is started, the CPU core 301 outputs an address corresponding to the on-board writing program I the mask ROM 307 to the instruction address bus B31. Then, the CPU core 301 reads the instruction codes for on-board writing from the mask ROM 307 through the instruction bus B32. Subsequently, the CPU core 301 executes the read instruction codes for on-board writing. The CPU core 301 further receives data and the like required for on-board writing from the ROM writer 400 through synchronous serial communication lines 401 to 404 and the synchronous serial communication interface 303. In this manner, the CPU core 301 executes a series of instruction codes (a program) for on-board writing stored in the mask ROM 307, whereby writing the flash memory 305 is performed.

Accordingly, because the mask ROM is needed to store programs for executing communication and sequencing for on-board writing, the size of the circuit has been increased. In particular, the microcomputer has suffered from a problem in that as the chip area for incorporating the mask ROM increases, the number of terminals also increases.

Additionally, to change the pulse width of each control signal or the number of retries while performing on-board writing, programs stored in the mask ROM need to be altered. In regard to this, it can be considered that programs in the mask ROM are created beforehand to output each of the control signals with multiple kinds of pulse widths. However, there has been a problem in that as the program size increases, the mask ROM size also increases.

As a method for solving such problems, it can be considered that programs for on-board writing are stored in the RAM and executed. However, a 4-bit microcomputer is generally configured to have no work RAM. Besides, even when the RAM is included, the 4-bit microcomputer or the like has varying data widths and instruction widths and thus it has been difficult to store the programs for on-board writing in the RAM and to execute them.

Meanwhile, in a bootloader circuit described in Japanese Unexamined Patent Application Publication (Kokai) No. 11-149376, a ROM can be written by using an external communication interface but it cannot secure the pulse width of each control signal for writing the ROM, as described above.

In view of the points mentioned above, the object of the invention is to eliminate the need for a mask ROM when on-board writing is conducted to a non-volatile memory incorporated into a semiconductor integrated circuit, and to easily alter the pulse width of each control signal necessary to write into the non-volatile memory.

SUMMARY OF THE DISCLOSURE OF INVENTION

In order to solve the problems described above, a semiconductor integrated circuit in accordance with the present invention comprises a central processing unit (CPU), a non-volatile memory, and a communication interface for receiving a program to be executed by the CPU for writing onto the non-volatile memory by external communication and transmitting the received program to the CPU.

Here, the communication interface may receive the program to be executed by the CPU for writing into the non-volatile memory by external synchronous serial communications and transmits the received program to the CPU, and the communication interface may send serial clocks received by the synchronous serial communications to the CPU.

Additionally, a writing method in accordance with the present invention is a method for writing into a non-volatile memory incorporated in a semiconductor integrated circuit, the writing method comprising the steps of: (a) transmitting a program for writing into the non-volatile memory to a communication interface of the semiconductor integrated circuit by external communication; (b) sending the program received by the communication interface to a central processing unit (CPU) of the semiconductor integrated circuit; and (c) executing the received programs in the CPU to write into the non-volatile memory.

Here, step (a) may include the step of receiving the program for writing into the non-volatile memory be external synchronous serial communication, step (b) may include sending the program received by the communication interface to the CPU, and sending serial clocks received by the synchronous serial communications to the CPU, and step (c) may include executing the received program in the CPU with the serial clocks as operating clocks to write into the non-volatile memory.

According to the invention configured as described above, the program for writing into the non-volatile memory is transmitted by communication. Thus, the mask ROM or the like for storing the program for writing into the non-volatile memory can be eliminated, with the aim of simplifying the circuit or reducing the chip area. Thereby, a clock terminal for the mask ROM becomes unnecessary as well.

Additionally, it does not have fixed programs such as the programs stored in the mask ROM or the like and therefore problems with the programs are easily corrected.

Furthermore, the synchronous serial communication is used for transmitting the program for writing into the non-volatile memory to feed the serial clocks thereof to the CPU and to adjust the transmission timing of the program for writing into the non-volatile memory. Thereby, the pulse width of each of the control signals that are needed to write into the non-volatile memory is secured and the pulse width can be easily altered.

BRIEF DESCRIPTION OF DRAWINGS

FIG. 2 depicts a flowchart illustrating an operation of a ROM writer in FIG. 1;

DETAILED DESCRIPTION OF THE INVENTION

Figure 1:
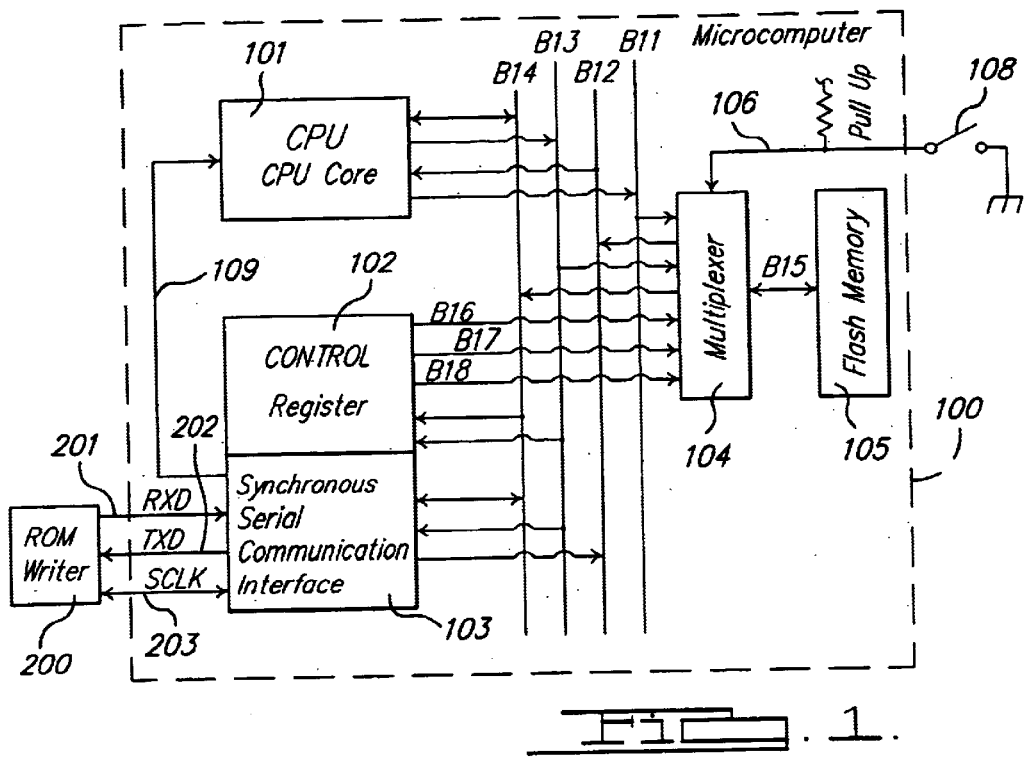
FIG. 1 depicts a block diagram illustrating a circuit configuration for on-board writing in one embodiment of the invention.

Hereafter, an the embodiment of the invention will be described in accordance with the drawings. In addition, the same components are designated the same reference numerals and a description thereof is omitted.

FIG. 1 depicts a block diagram illustrating a circuit configuration for on-board writing in one embodiment of the invention. The embodiment is made to apply the invention to a single chip microcomputer (hereinafter referred to as a microcomputer).

In FIG. 1, a microcomputer 100 is formed of a CPU core 101, a control register 102, a synchronous serial communication interface 103, a multiplexer 104, and a flash memory 105. The CPU core 101 is connected to the multiplexer 104 through an instruction address bus B11 and an instruction bus B12. Additionally, the CPU core 101 is connected to the control register 102, the synchronous serial communication interface 103, and the multiplexer 104 through a data address bus B13 and data bus B14.

The multiplexer 104 is connected to the flash memory 105 through a bus B15. The flash memory 105 is a non-volatile memory for storing instruction codes that the CPU core 101 should execute or data or the like that the CPU core 101 uses. Furthermore, other peripheral equipment or interfaces that are unnecessary to describe the invention are omitted in the drawings.

When programs are written into the flash memory 105, a ROM writer 200 is connected to the synchronous serial communication interface 103. A series of instruction codes (a program) to be executed by the CPU core 101 for writing into the flash memory 105 is downloaded and stored in advance in the ROM writer 200 from a personal computer (not shown). The ROM writer 200 transmits the operating clocks of the CPU core 101 or instruction codes for on-board writing by synchronous serial communication. The instruction codes include control codes and writing data.

The synchronous serial communication interface 103 is connected to the CPU core 101 through a serial clock feeding line 109. The synchronous serial communication interface 103 converts the received serial data to parallel data and the CPU core 101 executes a plurality of continuous instruction codes (a program) thus obtained. Thereby, on-board programming of the flash memory 105 is conducted. Here, in the program to be transmitted, jump instructions are not used; a plurality of continuous instructions is executed step by step.

Synchronous serial communication uses a RXD signal line 201 for transmitting data from the ROM writer 200 to the microcomputer 100, a TXD signal line 202 for transmitting data from the microcomputer 100 to the ROM writer 200, and a SCLK signal line 203 for transmitting and receiving serial clocks between the ROM writer 200 and the microcomputer 100.

The control register 102 is connected to the CPU core 101 as described above and is also connected to the multiplexer 104 through a flash memory writing address bus B16, a flash memory writing data bus B17, and a control signal bus B18. The control register 102 holds data written by the CPU core 101 and outputs the data to the flash memory writing address bus B16, the flash memory writing data bus B17, and the control signal bus B18. The control register 102 is mapped in an address space of the CPU core 101. It is connected to the data address bus B13 and the data bus B14 and the CPU core 101 accesses it. Additionally, the output of the control register 102 is connected to the flash memory 105 through the multiplexer 104.

The multiplexer 104 is connected to the CPU core 101 and the flash memory 105 as described above, and is also connected to a switch 108 through a flash memory writing mode designation line 106. The switch 108 is turned on (closed) to ground the flash memory writing mode designating line 106 when on-board writing is conducted, and is turned off (opened) to pull up the flash memory writing mode designating line 106 when on-board writing is not conducted. The multiplexer 104 connects the buses B11 to B14 with the bus B15 when the flash memory writing mode designating line 106 is pulled up, and connects the buses B16 to B18 with the bus 815 when the flash memory writing mode designating line 106 is ground.

Next, the normal operation (the operation other than the on-board writing operation) of the microcomputer 100 in the embodiment will be described. In addition, during normal operation, the switch 108 is turned off and the flash memory writing mode designating line 106 is pulled up.

First, the CPU core 101 outputs an instruction address on the instruction address bus 811. The multiplexer 104 transmits the instruction address outputted on the instruction address bus B11 to the bus B15. The flash memory 105 receives the instruction address from the bus B15 and outputs an instruction code corresponding to the address to the bus B15. The multiplexer 104 transmits the instruction code outputted on the bus B15 to the instruction bus B12. The CPU core 101 receives the instruction code from the instruction bus 812 and executes the instruction code. In this manner, the CPU core 101 executes a series of instruction codes (a program) stored in the flash memory 105.

Next, the on-board writing operation in the embodiment will be described. When on-board writing is conducted, an on-board writing operator turns on the switch 108 and the power supply of the microcomputer 100 and also turns on the power supply of the ROM writer 200 to start the operation.

When the operator starts the operation of the ROM writer 200, the ROM writer 200 starts the process based on the flowchart shown in FIG. 2.

In step S201, the ROM writer 200 extracts one instruction code (including data) from the stored series of instruction codes.

In the subsequent step S202, the ROM writer 200 serially converts the instruction code extracted at step S201. Then, the ROM writer 200 transmits the serially converted instruction code to the synchronous serial communication interface 103 in the microcomputer 100 through synchronous serial communication lines RXD 201, TXD 202 and SCLK 203.

The synchronous serial communication interface 103 in the microcomputer 100 receives the serial data from the ROM writer 200 and then performs parallel conversion on the received data. Then, the synchronous serial communication interface 103 outputs the parallel-converted data, that is, the instruction code to the instruction bus B12. Along with this, the synchronous serial communication interface 103 outputs serial clocks that have been received through the SCLK signal line 203 to the CPU core 101 through a serial clock feeding line 109.

Figure 3:
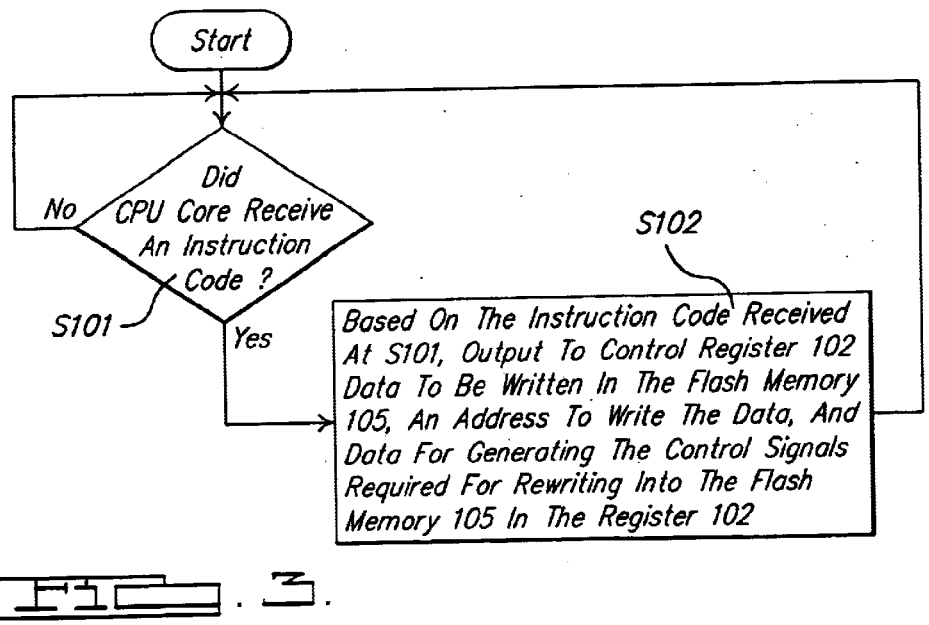
FIG. 3 depicts a flowchart illustrating an operation of a CPU core in FIG. 1.

Meanwhile, when receiving the serial clocks from the synchronous serial communication interface 103 through the serial clock feeding line 109, the CPU core 101 in the microcomputer 100 starts the flowchart shown in FIG. 3.

In first step S101, the CPU core 101 in the microcomputer 100 waits to receive an instruction code from the synchronous serial communication interface 103.

Upon receiving the instruction code that has been outputted by the synchronous serial communication interface 103 onto the instruction bus B12, the CPU core 101, that has waited at step S101, proceeds to step S102 in the process.

At step S102, the CPU core 101 outputs to the control register 102 data that has to be written in the flash memory 105, an address in the flash memory 105 to which the data has to be written, and data for generating control signals necessary to write into the flash memory 105, based on the instruction code received at step S101. Then, the CPU core 101 returns the process to step S101.

The control register 102 receives the data that has to be written in the flash memory 105, the address in the flash memory 105 to which the data has to be written, and the data for generating the control signals necessary to write the program into the flash memory 105 from the CPU core 101. The control register 102 then outputs the data that has to be written into the flash memory 105 to the flash memory writing data bus B17, the address in the flash memory 105 to which the data has to be written to the flash memory writing address bus B16, and the control signals necessary to write into the flash memory 105 to the control signal bus B18, according to the received data.

In this manner, the data that has to be written in the flash memory 105 is outputted to the flash memory writing data bus B17, the address in the flash memory 105 to which the data has to be written is outputted to the flash memory writing address bus B16, and the control signals necessary to write into the flash memory 105 are outputted to the control signal bus B18, and then are transmitted to the flash memory 105 through the multiplexer 104 and the bus B15 for writing into the flash memory 105.

Meanwhile, the ROM writer 200 transmits the instruction code at step S202 (Fig. 2) and then the ROM writer 200 checks at the subsequent step S203 whether a waiting time is needed after the instruction code sent at step S202 is executed by the CPU core 101, that is, whether the control signals outputted to the control signal bus B18 are needed to secure holding time. In a case where the waiting time is needed, the ROM writer 200 proceeds to step S204 in the process; otherwise, the ROM writer 200 proceeds to step S205.

When it determines that the waiting time is needed at step S203, the ROM writer 200 suspends the transmission of the instruction code for the required waiting time at step S204.

After the required time has passed at step S204 or in the case that it is determined that waiting time is not needed at step S203, the ROM writer 200 checks at step S205 whether any instruction codes to be transmitted still remain. When the ROM writer 200 determines that instruction codes to be transmitted still remain, the process returns to step S201; whereas when the ROM writer 200 determines that no instruction codes to be transmitted remain, the process is terminated.

Figure 4:
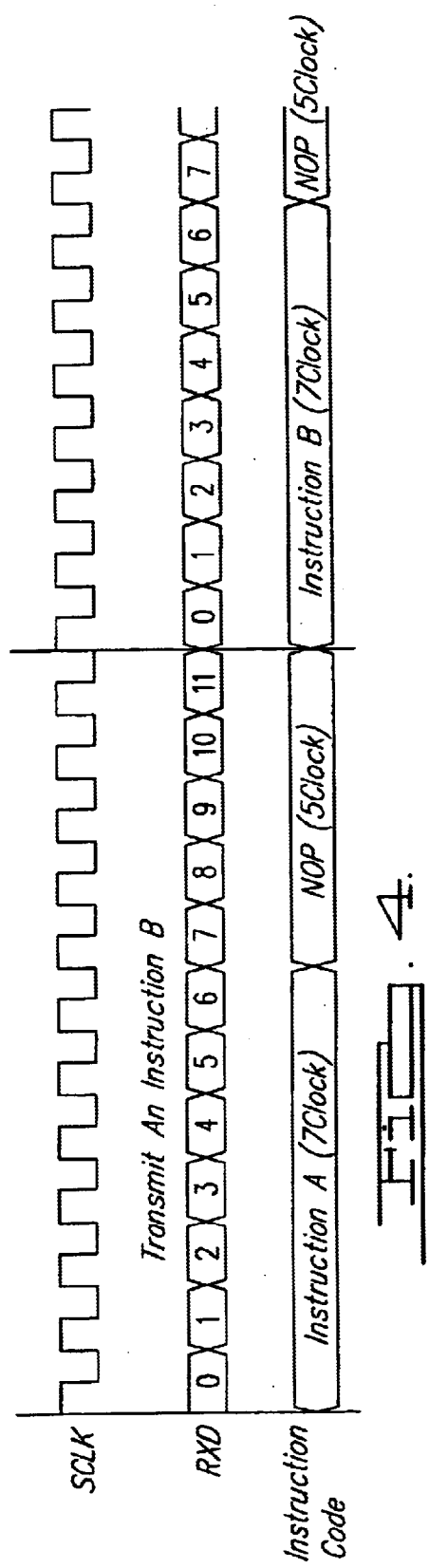
FIG. 4 depicts a timing chart for describing the principle of transmitting instructions in one embodiment of the invention.

Next, the principle of transmitting an instruction code in one embodiment will be described by way of the timing chart shown in FIG. 4.

When the instruction code is transmitted in synchronism with the serial clocks, there is no problem where the bit width (the number of clocks for transmitting the instruction code) of the instruction code is equal to the number of clocks for executing the instruction. However, when they are not equal, both cycles need to be adjusted by the following method. For example, as shown in FIG. 4, when instruction codes A and B have a width of 12 bits, at least 12 clocks are needed to serially transmit each of them. However, when the execute cycle of the instruction code A is seven clocks, the cycles are not matched between the transmission of the instruction code and the execution of the instruction. Then, in the embodiment, a dummy instruction NOP is inserted for five clocks (=12 clocks−7 clocks) until the next instruction code B is sent. Thereby, the cycles can be matched between the transmission of the instruction code and the execution of instruction.

Next, the principle of altering the pulse width of the control signals in the embodiment will be described by using the timing chart shown in FIG. 5.

Figure 5:
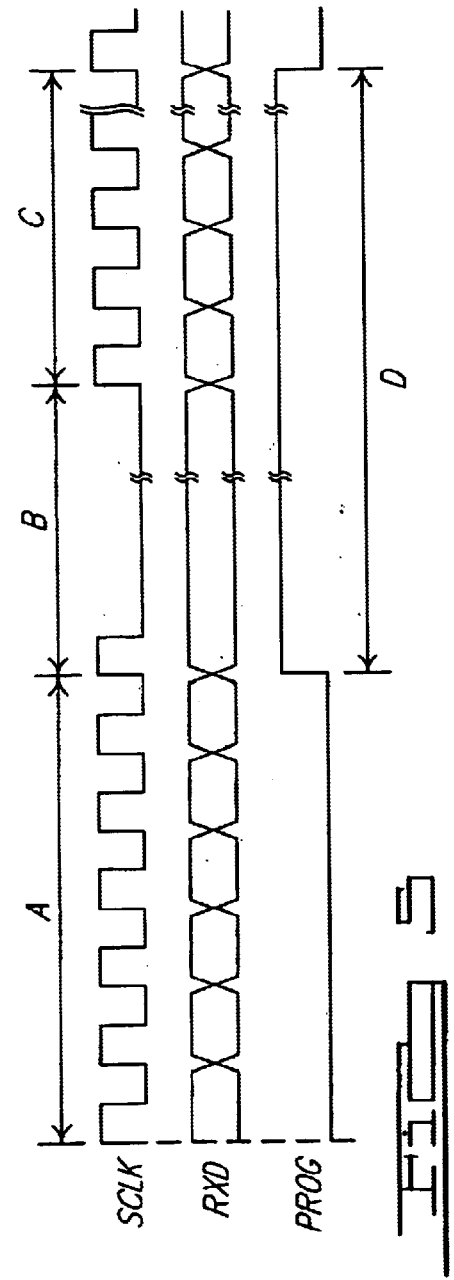
FIG. 5 depicts a timing chart for describing the principle of altering pulse widths of control signals in one embodiment of the invention.
Figure 6:
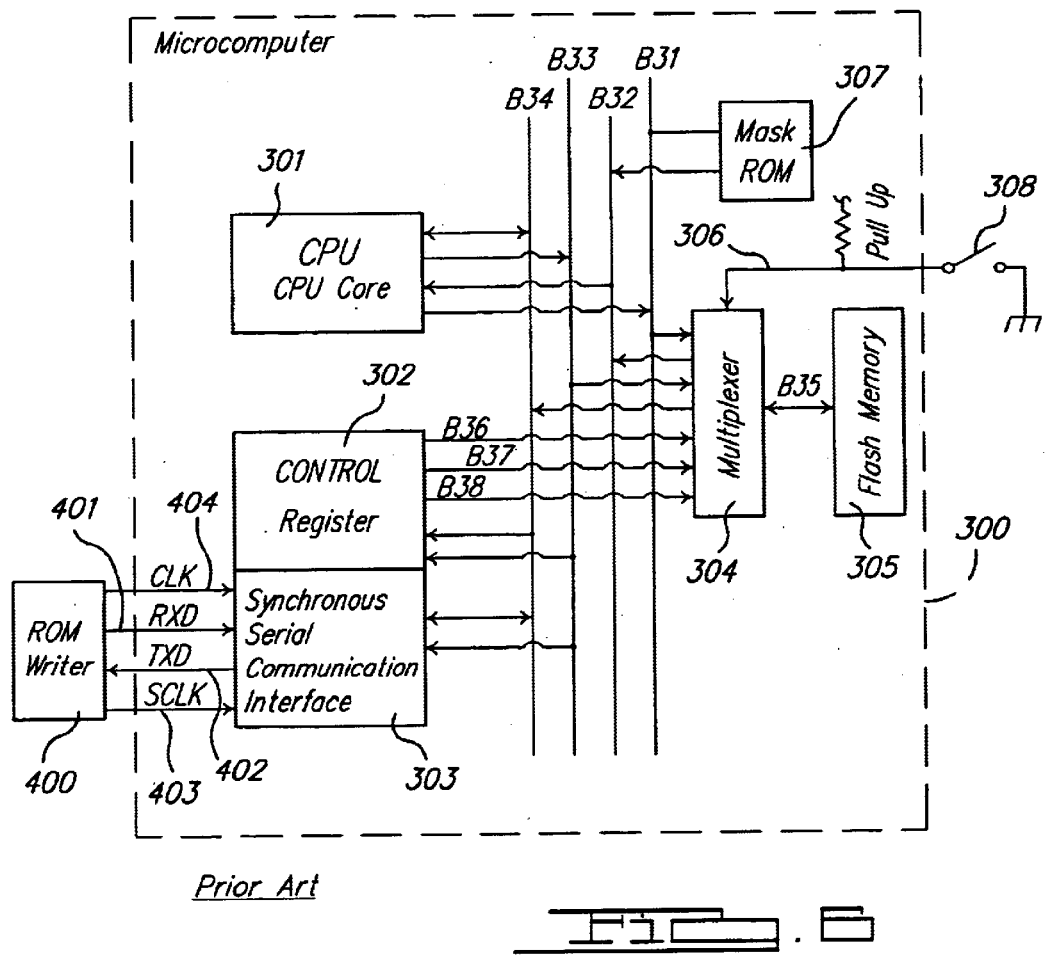
FIG. 6 depicts a block diagram illustrating an example of a circuit configuration for conventional on-board writing.

In FIG. 5, signals in the top waveform are serial clock signals inputted from the SCLK signal line 203, signals in the middle waveform are data signals inputted from the RXD signal line 201, and signals in the lower waveform are PROG signals which are one of the control signals outputted to the control signal bus B18. Here, the PROG signals are signals for writing into the flash memory 105, assuming that they need a pulse width of 1 ms, for example. That is, in FIG. 5, a time period D is set at 1 ins.

First, the ROM writer 200 transmits the instruction code executed by the CPU core 101 to set the PROG signal to "1" by synchronous serial communication (time period A). This instruction code is executed by the CPU core 101 and then the FROG signal is set to "1". The ROM writer 200 then suspends synchronous serial communications in order to secure the required pulse width of the PROG signal (time period B). After the period of time for securing the required pulse width, the ROM writer 200 transmits the instruction code executed by the CPU core 101 for setting the PROG signal to "0," by synchronous serial communication (time period C). This instruction code is executed by the CPU core 101 and then the PROG signal is set to "0". In this manner, suspending synchronous serial communication allows the pulse width of the control signals to be secured. In addition, by changing the length of suspension, the pulse width of the control signals can be easily altered.

As described above, according to the invention, the programs for writing into the non-volatile memory are transmitted by synchronous serial communication. Thus, the mask ROM for storing the programs for writing into the non-volatile memory can be eliminated, with the aim of simplifying the circuit or reducing the chip area. Accordingly, the clock terminal for the mask ROM becomes unnecessary.

Furthermore, integrated circuits do not have the fixed programs such as the programs stored in the mask ROM and therefore problems in the programs can be corrected easily.

Moreover, synchronous serial communication is used for transmitting the programs for writing into the non-volatile memory to feed the serial clocks thereof to the CPU and to adjust the transmission timing of the programs for writing into the non-volatile memory. Thereby, the pulse width of each of the control signals necessary to write into the non-volatile memory is secured and the pulse width can be easily altered.

What is claimed is:

1. A semiconductor integrated circuit comprising:
   a central processing unit (CPU);
   a non-volatile memory; and
   a communication interface adapted to receive a first plurality of codes including a program to be executed by said CPU for writing into said non-volatile memory by external communication in serial form, wherein said communication interface receives serial clocks and said first plurality of codes including said program via an external synchronous serial communication and sends serial clocks received by said synchronous serial communication to said CPU and converts said first plurality of codes to a second plurality of codes in parallel form and transmits the second plurality of codes to said CPU in parallel form, wherein said CPU executes the second plurality of codes and writes into said non-volatile memory.

2. The semiconductor integrated circuit according to claim 1, wherein said second plurality of codes is continuous.

3. A method for writing into a non-volatile memory incorporated in a semiconductor integrated circuit, comprising the steps of:
   (a) receiving a program for writing into said non-volatile memory via an external synchronous serial communication interface of said semiconductor integrated circuit by external communication;
   (b) sending the program received by said communication interface to a central processing unit (CPU) of said semiconductor integrated circuit; and sending serial clocks received via said communication interface to said CPU; and
   (c) executing the program sent to said CPU with the serial clocks as operating clocks to write into said non-volatile memory.

* * * * *